US009214775B2

(12) United States Patent
Watanabe et al.

(10) Patent No.: US 9,214,775 B2
(45) Date of Patent: Dec. 15, 2015

(54) JOINT CONNECTOR AND METHOD FOR IDENTIFYING BUS BAR PATTERN IN JOINT CONNECTOR

(75) Inventors: Tetsuya Watanabe, Makinohara (JP); Jun Ishikawa, Tokyo (JP)

(73) Assignee: YAZAKI CORPORATION, Tokyo (JP)

( * ) Notice: Subject to any disclaimer, the term of this patent is extended or adjusted under 35 U.S.C. 154(b) by 618 days.

(21) Appl. No.: 13/601,054

(22) Filed: Aug. 31, 2012

(65) Prior Publication Data

US 2012/0326698 A1 Dec. 27, 2012

Related U.S. Application Data

(63) Continuation of application No. PCT/JP2011/058368, filed on Mar. 25, 2011.

(30) Foreign Application Priority Data

Mar. 25, 2010 (JP) ................................ 2010-070561

(51) Int. Cl.

*H01R 11/01* (2006.01)
*G01R 29/00* (2006.01)
*H01R 31/08* (2006.01)

(52) U.S. Cl.

CPC ............ *H01R 31/08* (2013.01); *H01R 2201/20* (2013.01)

(58) Field of Classification Search

None

See application file for complete search history.

(56) References Cited

U.S. PATENT DOCUMENTS

| | | | | | |
|---|---|---|---|---|---|
| 4,471,158 | A * | 9/1984 | Roberts | H05K 1/0287 | 174/541 |
| 4,591,221 | A * | 5/1986 | De Brouckere | H01R 31/00 | 439/181 |
| 4,621,883 | A * | 11/1986 | Noguchi | H01R 13/5219 | 439/271 |
| 4,735,581 | A * | 4/1988 | Endo | H01R 13/5205 | 439/279 |
| 4,895,533 | A * | 1/1990 | Yagi | H01R 13/5205 | 439/278 |

(Continued)

FOREIGN PATENT DOCUMENTS

| | | | |
|---|---|---|---|
| JP | 07230864 | A | 8/1995 |
| JP | 07263097 | A | 10/1995 |
| JP | 2006324046 | A | 11/2006 |

OTHER PUBLICATIONS

International Search Report (PCT/ISA/210) issued by the International Searching Authority in corresponding International Application No. PCT/JP2011/058368 on Jul. 26, 2011.

(Continued)

*Primary Examiner* — Jermele M Hollington
*Assistant Examiner* — Suresh K Rajaputra
(74) *Attorney, Agent, or Firm* — Sughrue Mion, PLLC

(57) ABSTRACT

A joint connector includes a bus bar and a housing. The bus bar juxtaposes plural tab pieces to be connected to mating terminals. The housing has a bus bar accommodating part accommodating the bus bar, and includes plural terminal receiving chambers for receiving the mating terminals. The housing is formed with plural continuity check holes at a back end of the housing so as to expose a back end of the bus bar. In a case where the plural bus bars are accommodated in the bus bar receiving parts, at least one of the continuity check holes is positioned between the adjacent bus bars, and the at least one of the continuity check holes is formed in a resin-sealed part filled with an insulating resin material.

3 Claims, 7 Drawing Sheets

(56) References Cited

U.S. PATENT DOCUMENTS

| | | | | | | |
|---|---|---|---|---|---|---|
| 4,952,155 | A | * | 8/1990 | Kuzuno | H01R 31/08 | 439/189 |
| 4,997,390 | A | * | 3/1991 | Scholz | H01R 31/08 | 439/509 |
| 5,000,699 | A | * | 3/1991 | Nadin | H01R 31/08 | 439/189 |
| 5,124,660 | A | * | 6/1992 | Cilingiroglu | G01R 31/312 | 324/538 |
| 5,201,667 | A | * | 4/1993 | Endo | H01R 31/08 | 439/189 |
| 5,490,785 | A | * | 2/1996 | Hein | H01R 13/6658 | 439/587 |
| 5,496,188 | A | * | 3/1996 | Okamura | H01R 31/08 | 439/189 |
| 5,540,602 | A | * | 7/1996 | Bell | H01R 31/08 | 439/721 |
| 5,545,055 | A | * | 8/1996 | Tanaka | H01R 31/08 | 439/189 |
| 5,556,291 | A | * | 9/1996 | Ito | H01R 13/4367 | 439/189 |
| 5,562,468 | A | * | 10/1996 | Sakai | H01R 31/085 | 439/189 |
| 5,616,039 | A | * | 4/1997 | Morley | H01R 29/00 | 439/188 |
| 5,738,549 | A | * | 4/1998 | Laquerbe | H01R 13/4361 | 439/724 |
| 5,788,519 | A | * | 8/1998 | Stern | H01R 31/085 | 439/189 |
| 5,964,624 | A | * | 10/1999 | Pernelle | H01R 31/02 | 439/357 |
| 6,146,788 | A | * | 11/2000 | Ikeda | H01M 2/206 | 429/121 |
| 6,152,776 | A | * | 11/2000 | Ikeda | H01M 2/1077 | 429/121 |
| 6,168,470 | B1 | * | 1/2001 | Ikeda | H01M 2/1083 | 439/620.08 |
| 6,171,140 | B1 | * | 1/2001 | Anbo | H01R 13/7032 | 439/516 |
| 6,186,806 | B1 | * | 2/2001 | Suzuki | H01R 13/422 | 439/189 |
| 6,193,549 | B1 | * | 2/2001 | Suzuki | H01R 13/4223 | 439/511 |
| 6,290,521 | B1 | * | 9/2001 | Suzuki | H01R 13/4223 | 439/189 |
| 6,341,984 | B1 | * | 1/2002 | Murakami | H01R 13/5208 | 439/587 |
| 6,402,548 | B1 | * | 6/2002 | Ruiz | H01R 31/08 | 439/395 |
| 6,814,627 | B2 | * | 11/2004 | Yamamoto | H01R 13/447 | 439/149 |
| 6,848,953 | B2 | * | 2/2005 | Schell | H01R 13/055 | 439/825 |
| D511,142 | S | * | 11/2005 | de Jonge | D13/147 | |
| 7,056,150 | B2 | * | 6/2006 | Saka | H01R 31/08 | 439/511 |
| 7,118,423 | B2 | * | 10/2006 | Kobayashi | H01R 31/085 | 439/638 |
| 7,182,631 | B2 | * | 2/2007 | Kollmann | H01R 13/6599 | 439/511 |
| 7,241,168 | B2 | * | 7/2007 | Sakurai | H01R 31/085 | 439/511 |
| 7,351,085 | B2 | * | 4/2008 | Tamagawa | H01R 12/592 | 439/189 |
| D619,099 | S | * | 7/2010 | Ngo | D13/154 | |
| 7,762,853 | B2 | * | 7/2010 | Channell, Sr. | B29C 45/14426 | 439/709 |
| 7,883,362 | B2 | * | 2/2011 | Ichio | H01R 13/40 | 439/511 |
| 7,883,365 | B2 | * | 2/2011 | Saitou | H01R 13/5205 | 439/587 |
| 8,027,168 | B2 | * | 9/2011 | Senk | B60R 16/0238 | 174/387 |
| 8,083,543 | B2 | * | 12/2011 | Omori | H01R 13/4223 | 439/511 |
| 8,096,814 | B2 | * | 1/2012 | Schell | H01R 13/11 | 439/79 |
| 8,182,286 | B2 | * | 5/2012 | Tamagawa | H01R 13/5213 | 439/587 |
| 8,235,732 | B2 | * | 8/2012 | Garascia | H01M 2/1077 | 439/500 |
| 8,323,049 | B2 | * | 12/2012 | Ngo | H01R 13/6275 | 439/552 |
| 8,376,778 | B2 | * | 2/2013 | Obata | H01R 13/4223 | 439/595 |
| 8,569,623 | B2 | * | 10/2013 | Matsuoka | H01R 13/5208 | 174/74 R |
| 8,610,005 | B2 | * | 12/2013 | Iida | B60R 16/0239 | 174/520 |
| 8,727,796 | B2 | * | 5/2014 | Ngo | H01R 12/75 | 439/660 |
| 2004/0149550 | A1 | * | 8/2004 | Allen | H01H 9/0264 | 200/1 R |
| 2005/0266731 | A1 | * | 12/2005 | Kobayashi | H01R 31/085 | 439/654 |
| 2010/0255701 | A1 | * | 10/2010 | Bollmann | H01R 9/2458 | 439/213 |
| 2012/0300522 | A1 | * | 11/2012 | Tokuyama | H01L 25/072 | 363/131 |
| 2012/0326698 | A1 | * | 12/2012 | Watanabe | H01R 31/08 | 324/66 |

OTHER PUBLICATIONS

Written Opinion (PCT/ISA/237) of the International Searching Authority, issued in corresponding International Application No. PCT/JP2011/058368 on Jul. 26, 2011.

Office Action dated Jun. 19, 2014, issued by The State Intellectual Property Office of The People's Republic of China in counterpart Chinese Application No. 201180015904.6.

* cited by examiner

JOINT CONNECTOR AND METHOD FOR IDENTIFYING BUS BAR PATTERN IN JOINT CONNECTOR

CROSS REFERENCE TO RELATED APPLICATION

This application is a continuation of PCT application No. PCT/JP2011/058368, which was filed on Mar. 25, 2011 based on Japanese Patent Application (No. 2010-070561) filed on Mar. 25, 2010, the contents of which are incorporated herein by reference. Also, all the references cited herein are incorporated as a whole.

BACKGROUND OF THE INVENTION

1. Technical Field

The present invention relates to a joint connector and a method for identifying a bus bar pattern in the joint connector.

2. Background Art

FIG. 6 shows a conventional joint connector.

The conventional joint connector 101 is disclosed in JP-A-2006-324046, and includes a bus bar 111 formed of a metal plate and a housing 121 made of insulating resin for receiving and holding the bus bar 111.

The bus bar 111 juxtaposes plural tab pieces 112 capable of being connected to mating terminals. The plural tab pieces 112 are integrated with a coupling part 113 consecutively installed in a back ends of the tab pieces 112, and short-circuit connection between the mating terminals connected to each of the tab pieces 112 is made.

The housing 121 includes a housing body 124 in which bus bar accommodating parts 122 for accommodating the bus bar 111 are included in the back end side and also plural terminal receiving chambers 123 are formed in the front end side, and a cover 125 with which the back end of the housing body 124 is covered.

The terminal receiving chamber 123 is space for receiving the mating terminal connected to the tab piece 112, and the plural terminal receiving chambers 123 are disposed at an arrangement pitch of the tab pieces 112 in the bus bar 111. The bus bar 111 accommodated in the bus bar accommodating parts 122 is positioned in a state in which each of the tab pieces 112 protrudes to the respective terminal receiving chambers 123.

The mating terminal connected to the tab piece 112 is a female connecting terminal fitted into the tab piece 112, and is connected to the tab piece 112 by being inserted into the terminal receiving chamber 123 from a front side of the terminal receiving chamber 123.

The cover 125 is fitted and attached to the housing body 124 so as to cover the coupling part 113 which is the back end of the bus bar 111 from the back. Plural continuity check holes 127 are pierced in this cover 125 as shown in FIG. 7.

The continuity check hole 127 is a hole into which a continuity test pin 141 shown in FIG. 6 can be inserted. The plural continuity check holes 127 are disposed so as to expose the back end, that is the coupling part 113, of the bus bar 111 of the inside of the bus bar accommodating parts 122 at an arrangement pitch positioned in the middle between the adjacent terminal receiving chambers 123.

In the case of making a continuity check etc. of the bus bar 111 in the joint connector 101 described above, the continuity test pin 141 could be inserted into the continuity check hole 127 disposed in the back end of the housing 121 to bring the continuity test pin 141 into contact with the coupling part 113 of the bus bar 111 as shown in FIG. 6. Therefore, it is unnecessary to bring the continuity test pin 141 into contact with the tab piece 112 at the time of work of the continuity check, so that trouble such as deformation of the tab piece 112 can be prevented from occurring.

SUMMARY OF THE INVENTION

The joint connector has the case where plural connecting terminals received are divided into plural groups and short-circuit connection between the connecting terminals is made in the individual bus bar every group. For example, the joint connector 101 of FIG. 6 has the case where six terminal receiving chambers 123 are included in the same step and short-circuit connection between the two connecting terminals, of one side, of the six connecting terminals received in the terminal receiving chambers 123 of the same step is made in a bus bar with two poles and short-circuit connection between the four connecting mating terminals is made in a bus bar with four poles.

In such a case, the bus bar accommodating parts 122 are equipped with the plural bus bars of patterns corresponding to the number of poles in which arrangement of the tab pieces 112 is short-circuited.

When the plural bus bars are accommodated inside the bus bar accommodating parts 122 thus, the joint connector 101 described in JP-A-2006-324046 cannot easily determine which bus bars of the patterns are received by a visual check of appearance.

Also, in JP-A-2006-324046, a continuity test method of the received bus bar is described, but identification of the bus bar patterns in the case of receiving the plural bus bars is not suggested and there was a problem that the bus bar patterns cannot be identified easily.

It is therefore one advantageous aspect of the present invention to provide a joint connector capable of easily visually determining a pattern of a bus bar received in the joint connector and identifying the pattern of the received bus bar by a continuity test, and a method for identifying the bus bar pattern in the joint connector.

According to one aspect of the invention, there is provided a joint connector, comprising:

a bus bar for juxtaposing plural tab pieces to be connected to mating terminals, and a housing, having a bus bar accommodating part accommodating the bus bar, including plural terminal receiving chambers for receiving the mating terminals, and formed with plural continuity check holes at a back end of the housing so as to expose a back end of the bus bar, in a case where the plural bus bars are accommodated in the bus bar accommodating parts, at least one of the continuity check holes is positioned between the adjacent bus bars, and the at least one of the continuity check holes is formed in a resin-sealed part filled with an insulating resin material.

The continuity check holes may be arranged in a pitch so as to be arranged at middle between the adjacent terminal receiving chambers.

According to another aspect of the invention, there is provided a method for identifying a bus bar pattern in the joint connector described in the above, comprising:

preparing plural continuity test pins, disposed at positions each of which corresponding to the resin-sealed part provided in each of bus bar patterns;

preparing plural continuity pins, disposed at positions each of which corresponding to the continuity check holes which is not formed in the resin-sealed part in any bus bar patterns;

executing continuity tests for each of the continuity test pins; and identifying the bus bar pattern based on arrangement of the continuity test pins which become non-conducting to the bus bar.

According to the invention, when the plural bus bars are accommodated in the bus bar accommodating parts, the continuity check hole positioned between the adjacent bus bars is formed in the resin-sealed part and has a form different from the other continuity check holes in appearance, so that patterns of the bus bars received in the joint connector can easily be visually determined by visually checking the presence or absence of the resin-sealed part, a position of the resin-sealed part, etc.

According to the invention, only the continuity test pin corresponding to the position of the resin-sealed part becomes non-conducting when a continuity test is performed, so that the pattern of the bus bar received can be identified speedily and surely by determining whether or not any continuity test pin of the plural continuity test pins is non-conducting, and manufacture etc. of a wire harness equipped with the joint connector can be facilitated.

In the joint connector according to the invention, the patterns of the bus bars accommodated in the joint connector can easily be visually determined by visually checking the presence or absence of the resin-sealed part, the position of the resin-sealed part, etc.

Also, in the method for identifying the bus bar pattern in the joint connector according to the invention, only the continuity test pin corresponding to the position of the resin-sealed part becomes non-conducting when the continuity test is performed, so that the pattern of the bus bar received can be identified speedily and surely by determining whether or not any continuity test pin of the plural continuity test pins is non-conducting.

DETAILED DESCRIPTION OF THE EXEMPLIFIED EMBODIMENTS

A preferred embodiment of a joint connector and a method for identifying a bus bar pattern in the joint connector according to the invention will hereinafter be described in detail with reference to the drawings.

First, a configuration of the joint connector of one embodiment will be described.

Figure 1:
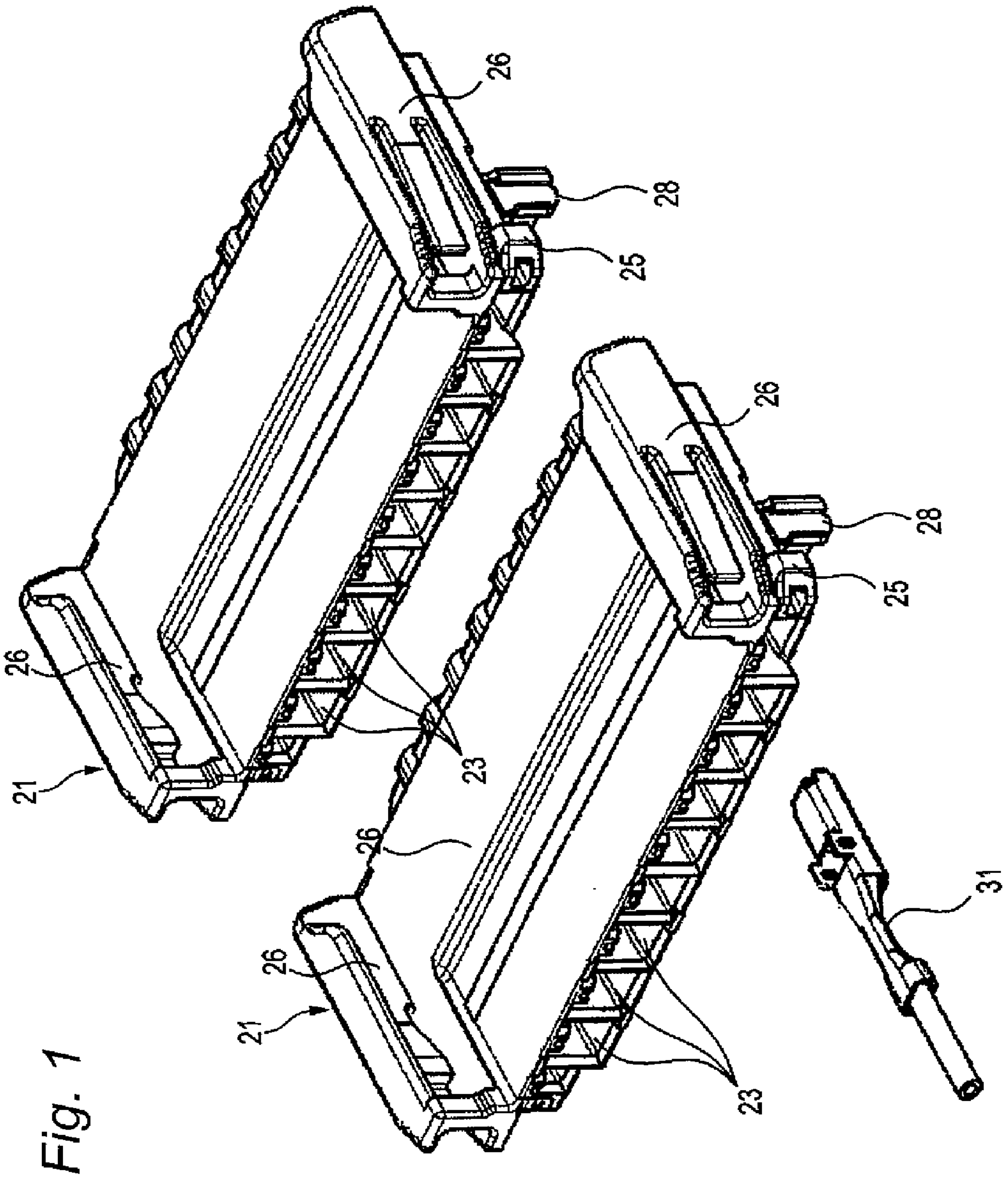
FIG. 1 is a perspective view of a joint connector according to an embodiment of the invention.
Figure 2A:
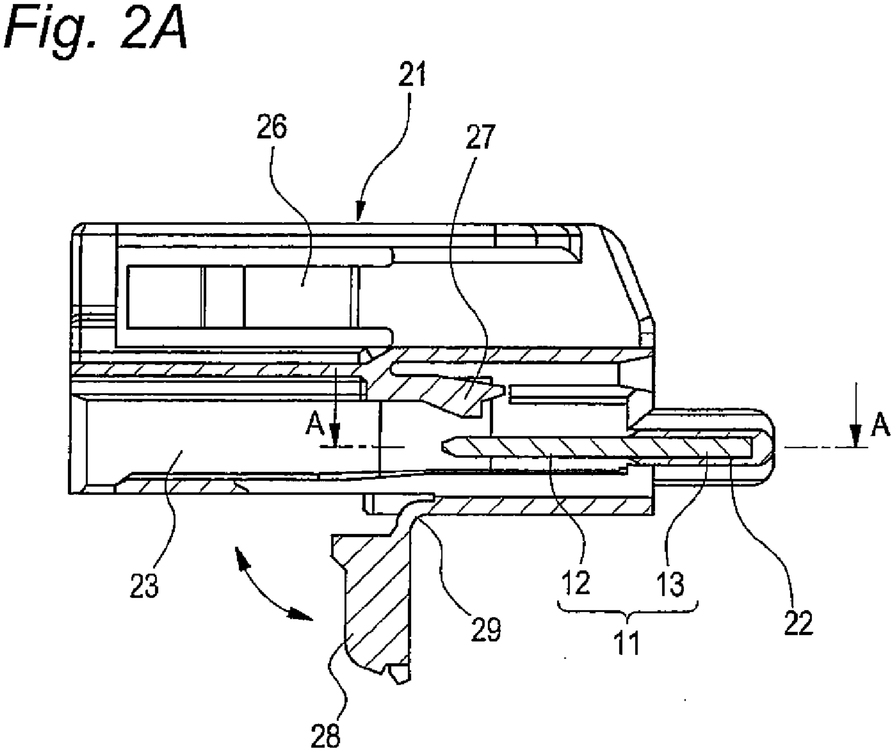
FIG. 2A is a longitudinal sectional view of a state before a connecting terminal of the joint connector shown in FIG. 1 is received.
Figure 2B:
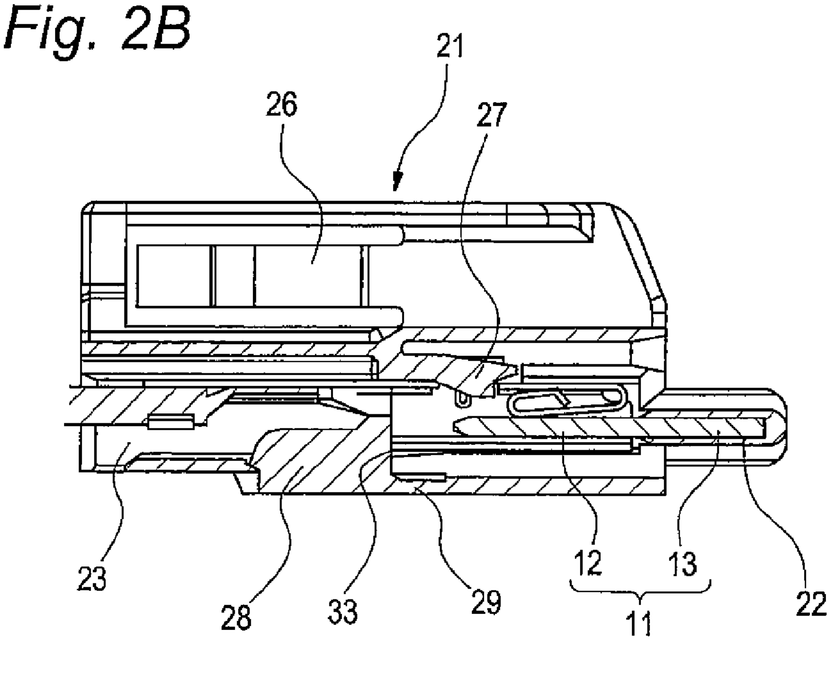
FIG. 2B is a longitudinal sectional view of a state of doubly locking the connecting terminal of the joint connector shown in FIG. 1.
Figure 3:
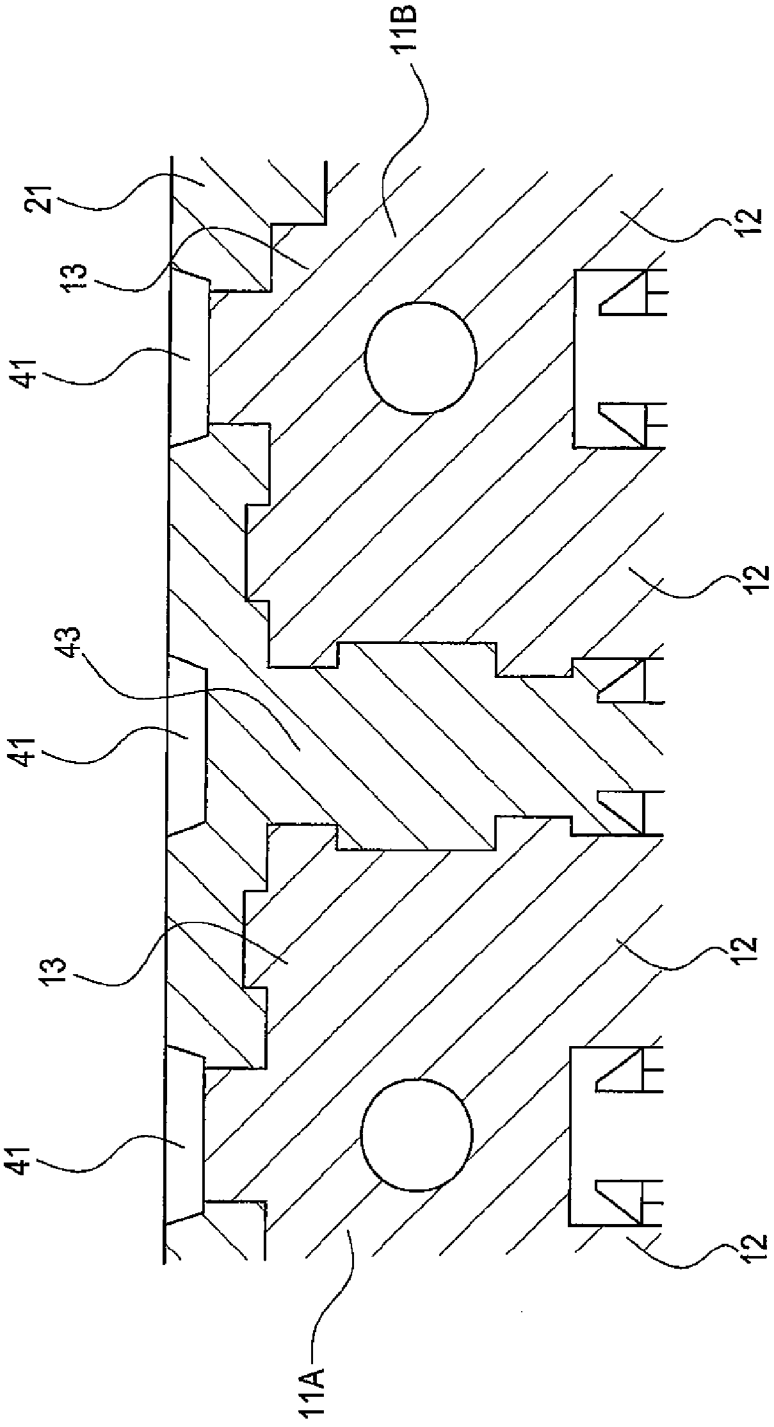
FIG. 3 is a sectional view taken on line A-A of FIG. 2A.
Figure 4:
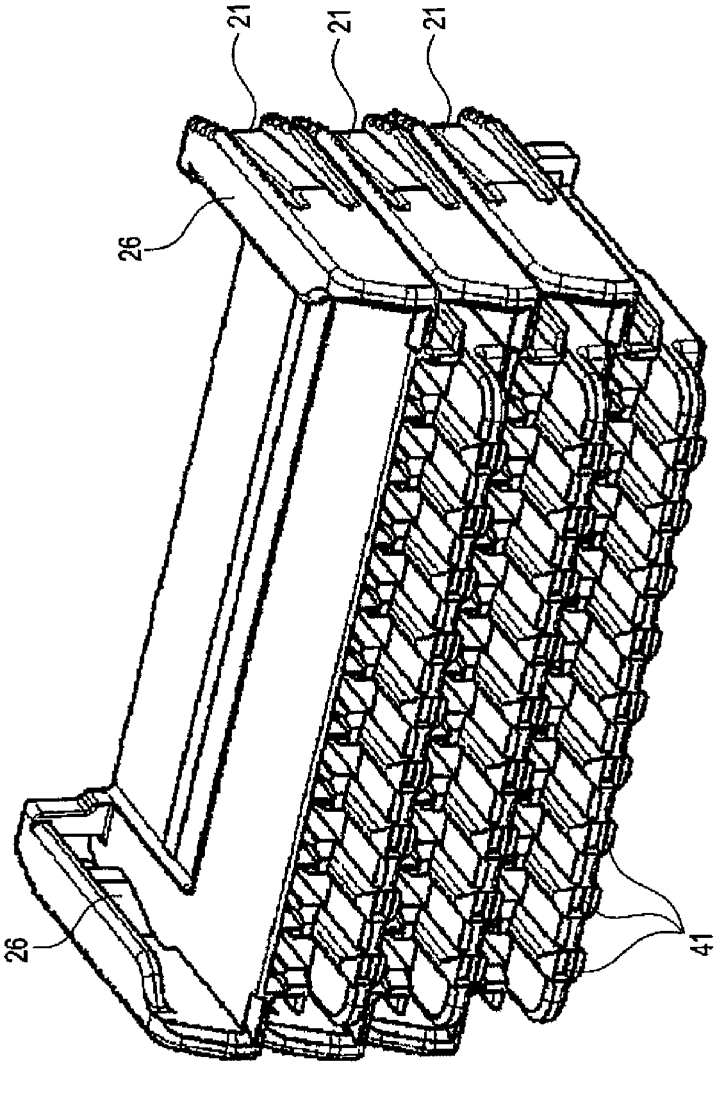
FIG. 4 is a perspective view of a state of uniting the three joint connectors shown in FIG. 1.

FIGS. 1 to 4 show the joint connector of one embodiment of the invention, and FIG. 1 is a perspective view seen from the oblique front of one embodiment of the joint connector according to the invention, and FIG. 2A is a longitudinal sectional view of a state before a connecting terminal of the joint connector shown in FIG. 1 is received, and FIG. 2B is a longitudinal sectional view of a state of doubly locking the connecting terminal of the joint connector shown in FIG. 1, and FIG. 3 is a sectional view taken on line A-A of FIG. 2A, and FIG. 4 is a perspective view of a state of uniting the three joint connectors shown in FIG. 1.

This joint connector 1 of one embodiment includes a bus bar 11 formed of a metal plate, and a housing 21 made of insulating resin for receiving and holding this bus bar 11.

The bus bar 11 juxtaposes plural tab pieces 12 capable of being fitted and connected to mating terminals 31. The plural tab pieces 12 are integrated with a coupling part 13 (see FIG. 4) consecutively installed in a back ends of the tab pieces 12, and short-circuit connection between the mating terminals 31 connected to each of the tab pieces 12 is made.

Also, in the housing 21 of the embodiment, the plural housings 21 can be united in a state of vertically laminating the plural mutual housings 21 in multiple steps and slide fitting protrusions 25 for coupling the mutual housings are provided on both side surfaces of the housing 21 as shown in FIGS. 1 and 4. Also, guides 26 for coupling for locking the slide fitting protrusions 25 of the other housing 21 stacked are formed integrally to the upper ends of both side surfaces of the housing 21.

In the housing 21 of the embodiment, bus bar accommodating parts 22 for accommodating the bus bar 11 are included in the back end side and also plural terminal receiving chambers 23 are formed in the front end side as shown in FIG. 2.

The housing 21 is equipped with the ten terminal receiving chambers 23 at equal distances in one line laterally. An arrangement pitch of the terminal receiving chambers 23 matches with an arrangement pitch of the tab pieces 12 in the bus bar 11.

Also, in the case of the housing 21 of the embodiment, a lance 27 for locking and retaining the mating terminal 31 inserted into the terminal receiving chamber 23 is provided inside the terminal receiving chamber 23 as shown in FIG. 2. Also, a double locking member 28 for regulating movement of the mating terminal 31 locked by the lance 27 and locking a locked state is provided in a position of a bottom wall of the terminal receiving chamber 23.

The double locking member 28 is formed integrally to a bottom wall of the housing 21 by a thin-wall hinge 29. The double locking member 28 can turn between a retracting position shown in FIG. 2A and a locking position shown in FIG. 2B by a turn through the thin-wall hinge 29 as shown in FIG. 2A. When the double locking member 28 moves in the locking position as shown in FIG. 2B, the double locking member 28 engages with a recess 33 of the back end of an angular tube-shaped fitting part of the mating terminal 31 and regulates movement of the mating terminal 31.

In the case of the embodiment, the bus bar 11 becomes received in the bus bar accommodating parts 22 by insert molding in the case of molding the housing 21.

In the case of the embodiment, the back end of the housing 21 is provided with plural continuity check holes 41 as shown in FIGS. 3 and 4. Each of the continuity check holes 41 is pierced in the back end of the housing so as to expose the back end of the bus bar 11 of the bus bar accommodating parts 22. Also, the plural continuity check holes 41 are disposed at an arrangement pitch positioned in the middle between the adjacent terminal receiving chambers 23. That is, an arrangement pitch is positioned in the middle between the adjacent tab pieces 12 of the bus bar 11.

Further, when plural bus bars 11A, 11B are accommodated in the bus bar accommodating parts 22 as shown in FIG. 3 in the case of the joint connector 1 of the embodiment, the continuity check hole 41 positioned between the adjacent bus bars 11A, 11B is formed in a resin-sealed part 43 filled with an insulating resin material.

In the joint connector 1 of the embodiment described above, when the plural bus bars 11A, 11B are accommodated in the bus bar accommodating parts 22, the continuity check hole 41 positioned between the adjacent bus bars 11A, 11B is formed in the resin-sealed part 43 and has a form different from the other continuity check holes 41 in appearance, so that patterns of the bus bars 11A, 11B received in the joint connector 1 can easily be visually determined by visually checking the presence or absence of the resin-sealed part 43, a position of the resin-sealed part 43, etc.

Next, a method for identifying a pattern of a bus bar received in the joint connector 1 of one embodiment described above by a continuity test will be described based on FIGS. 5A to 5D.

This method for identifying the bus bar pattern in one embodiment is a method capable of easily identifying the bus bar pattern by four continuity test pins 51*a*, 51*b*, 51*c*, 51*d* and three continuity pins 53*a*, 53*b*, 53*c* when there are plural positions in which the resin-sealed part 43 is formed according to a difference in the pattern of the bus bar 11 received in the bus bar accommodating parts 22 in the joint connector 1 of one embodiment.

The four continuity test pins 51*a*, 51*b*, 51*c*, 51*d* are placed in correspondence with positions of all the resin-sealed parts 43 generated in the joint connector 1 of one embodiment according to a difference in the bus bar pattern, and a continuity test is performed from the continuity check hole 41 of the corresponding position.

Figure 5B:
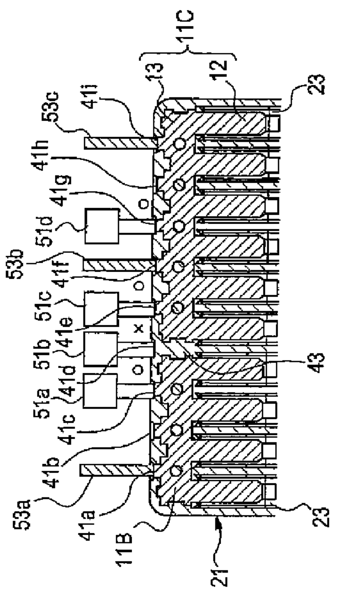
FIG. 5B is an explanatory diagram of a state at the time of the continuity test in the case of constructing the pattern of bus bars received in the housing of two bus bars with four poles and six poles.
Figure 5A:
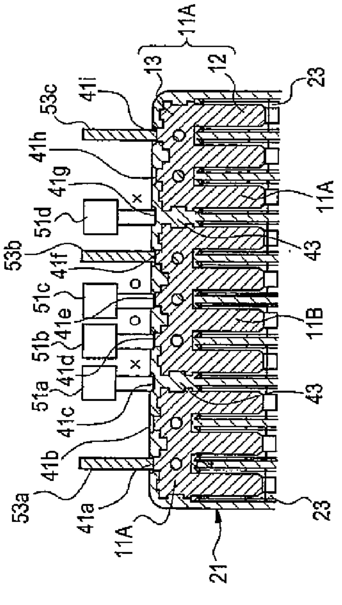
FIG. 5A is an explanatory diagram of a state at the time of a continuity test in the case of constructing the pattern of bus bars received in a housing of three bus bars with three poles, four poles and three poles.
Figure 5D:
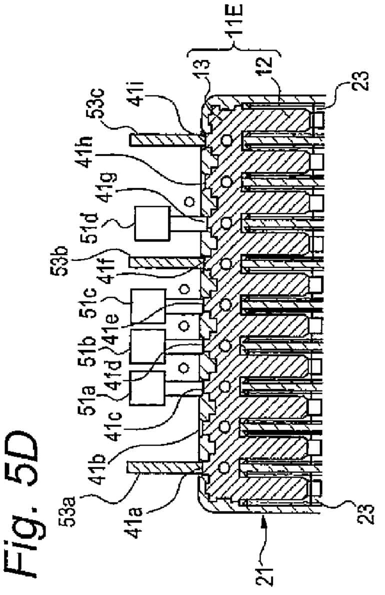
FIG. 5D is an explanatory diagram of a state at the time of the continuity test in the case of constructing the pattern of bus bars received in the housing of one bus bar with ten poles.
Figure 5C:
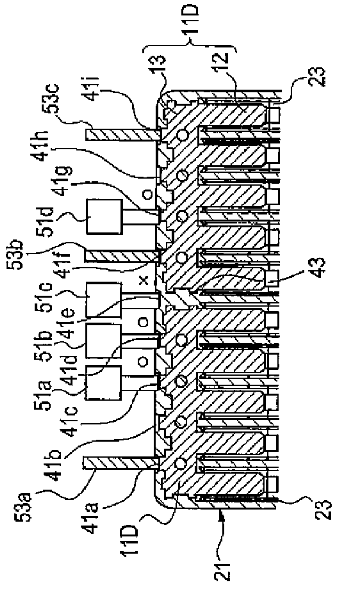
FIG. 5C is an explanatory diagram of a state at the time of the continuity test in the case of constructing the pattern of bus bars received in the housing of two bus bars with five poles and five poles.
Figure 6:
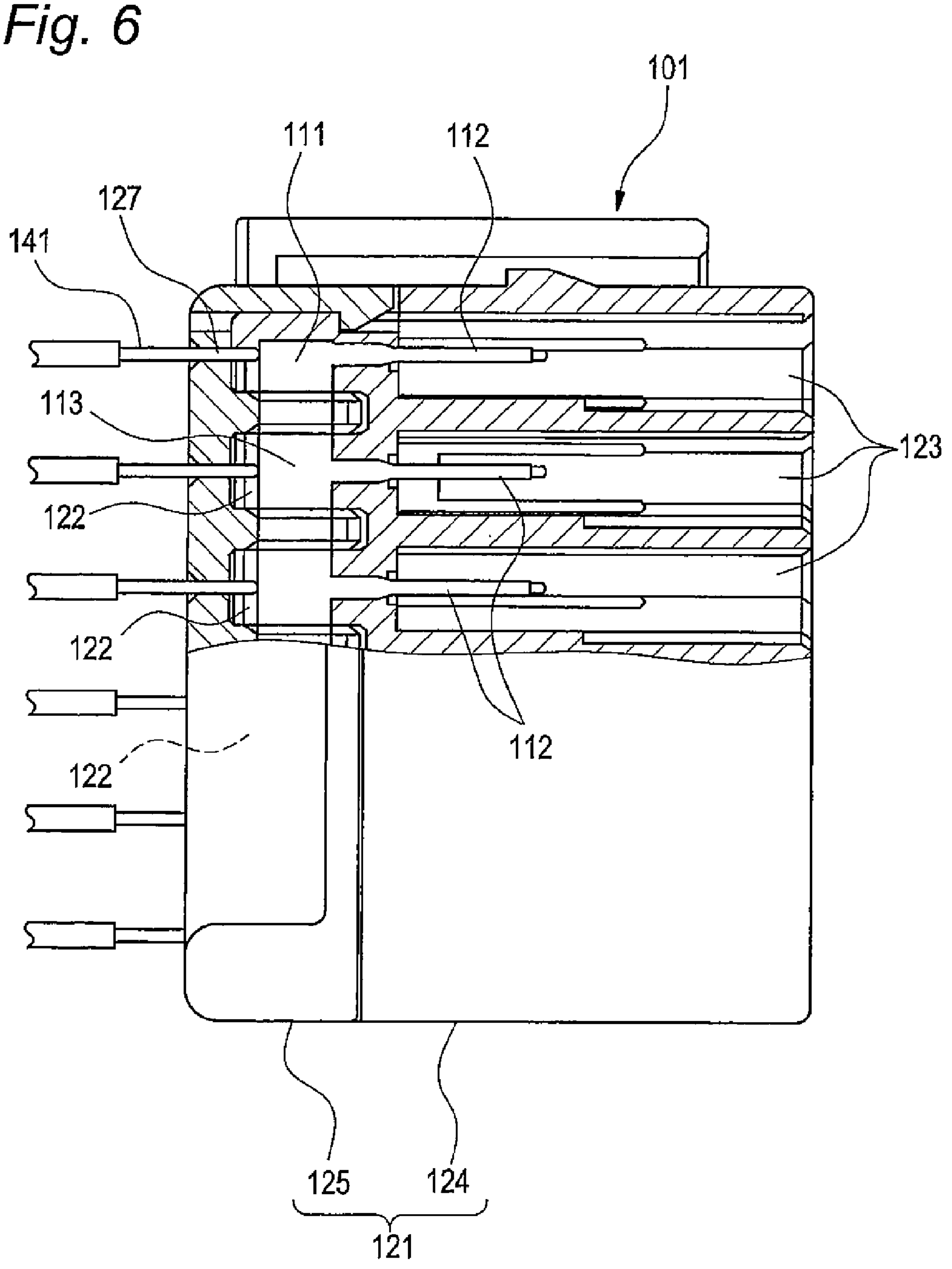
FIG. 6 is a sectional plan view of a part of a conventional joint connector.
Figure 7:
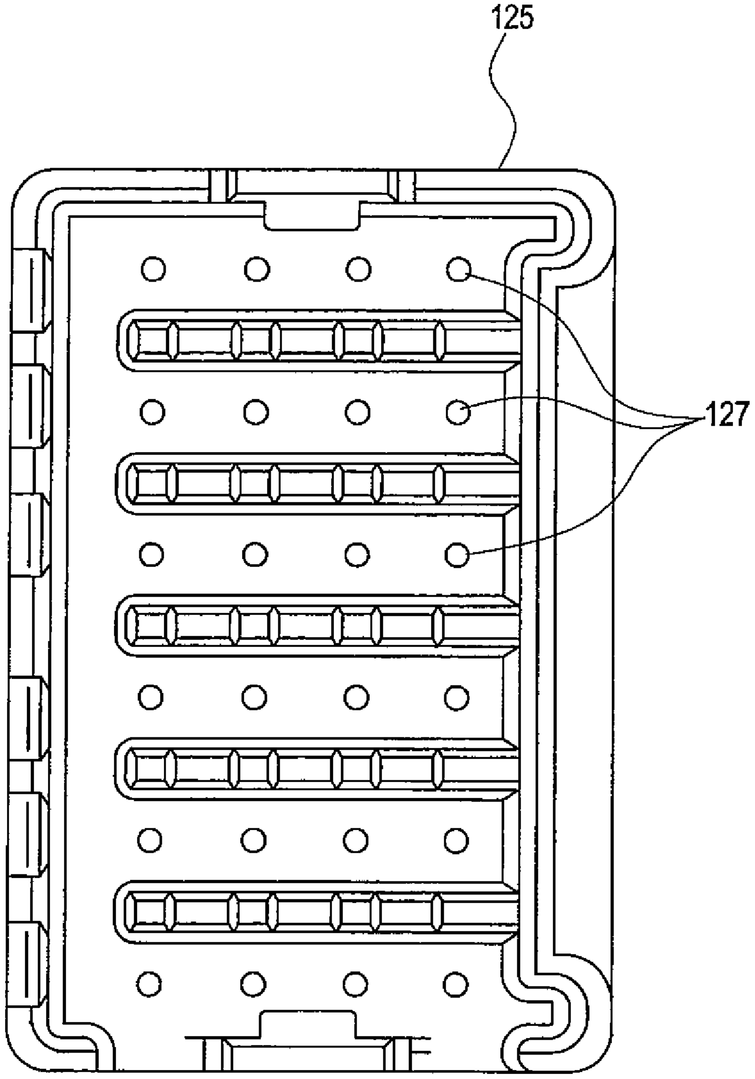
FIG. 7 is an inner surface view of a cover shown in FIG. 6.

In the case of the embodiment, a first pattern shown in FIG. 5A, a second pattern shown in FIG. 5B, a third pattern shown in FIG. 5C and a fourth pattern shown in FIG. 5D are considered as the bus bar patterns generated in the joint connector 1.

The first pattern shown in FIG. 5A is a pattern in which three bus bars of a bus bar 11A with three poles, a bus bar 11 B with four poles and a bus bar 11A with three poles in which the number of tab pieces 12 juxtaposed is three are placed sequentially from the left end in the drawing.

In this pattern, among the nine continuity check holes 41*a* to 41*i* arranged in the back end of the housing 21, the continuity check hole 41*c* located in the third from the left end and the continuity check hole 41*g* located in the seventh from the left end are set in the resin-sealed parts 43 filled with an insulating resin agent.

The continuity test pins 51*a*, 51*d* of the four continuity test pins 51*a*, 51*b*, 51*c*, 51*d* placed in the embodiment are placed in correspondence with the positions of each of the resin-sealed parts 43 generated in the first pattern shown in FIG. 5A.

The second pattern shown in FIG. 5B is a pattern in which two bus bars of a bus bar 11B with four poles and a bus bar 11C with six poles are placed sequentially from the left end in the drawing.

In this pattern, among the nine continuity check holes 41*a* to 41*i* arranged in the back end of the housing 21, the continuity check hole 41*d* located in the fourth from the left end is set in the resin-sealed part 43 filled with the insulating resin agent.

The continuity test pin 51*b* of the four continuity test pins 51*a*, 51*b*, 51*c*, 51*d* placed in the embodiment is placed in correspondence with the position of the resin-sealed part 43 generated in the second pattern shown in FIG. 5B.

The third pattern shown in FIG. 5C is a pattern in which two bus bars 11D with five poles are placed sequentially from the left end in the drawing.

In this pattern, among the nine continuity check holes 41*a* to 41*i* arranged in the back end of the housing 21, the continuity check hole 41*e* located in the fifth from the left end is set in the resin-sealed part 43 filled with the insulating resin agent.

The continuity test pin 51*c* of the four continuity test pins 51*a*, 51*b*, 51*c*, 51*d* placed in the embodiment is placed in correspondence with the position of the resin-sealed part 43 generated in the third pattern shown in FIG. 5C.

The fourth pattern shown in FIG. 5D is a pattern in which one bus bar 11E with ten poles is placed inside the bus bar accommodating parts 22.

In this pattern, all the nine continuity check holes 41*a* to 41*i* arranged in the back end of the housing 21 remain the through holes for exposing the back end of the bus bar 11E.

In all the cases of the four bus bar patterns shown in FIGS. 5A to 5D, the three continuity pins 53*a*, 53*b*, 53*c* are placed in correspondence with positions of the continuity check holes 41 in which resin-sealed part 43 is not formed so that each of the bus bars received in the housing 21 becomes conducting, and make conduction from the continuity check holes 41 of the corresponding positions to the bus bars 11.

As shown in FIGS. 5A to 5D, the continuity pin 53*a* is placed in the continuity check hole 41*a* located in the first from the left end in the drawing and conducts to the bus bar in contact. The continuity pin 53*b* is placed in the continuity check hole 41*f* located in the sixth from the left end in the drawing and conducts to the bus bar in contact. The continuity pin 53*c* is placed in the continuity check hole 41*i* located in the ninth from the left end in the drawing and conducts to the bus bar in contact.

In this method for identifying the bus bar pattern in the embodiment, a continuity test is performed by the four continuity test pins 51*a*, 51*b*, 51*c*, 51*d* and the three continuity pins 53*a*, 53*b*, 53*c* and the pattern of the bus bar received in the housing 21 is determined from arrangement of the continuity test pins which become non-conducting to the bus bar.

Concretely, the case where the two continuity test pins 51*a*, 51*d* become non-conducting is identified as the bus bar pattern shown in FIG. 5A, and the case where the one continuity test pin 51*b* becomes non-conducting is identified as the bus bar pattern shown in FIG. 5B, and the case where the one continuity test pin 51*c* becomes non-conducting is identified as the bus bar pattern shown in FIG. 5C, and the case where no continuity test pin becomes non-conducting is identified as the bus bar pattern shown in FIG. 5D.

In the method for identifying the bus bar pattern of one embodiment described above, only the continuity test pin corresponding to the position of the resin-sealed part 43 becomes non-conducting when the continuity test is performed, so that the pattern of the bus bar 11 received can be identified speedily and surely by determining whether or not any continuity test pin 51*a*, 51*b*, 51*c*, 51*d* is non-conducting, and manufacture etc. of a wire harness equipped with the joint connector 1 can be facilitated.

Although the invention has been illustrated and described for the particular preferred embodiments, it is apparent to a person skilled in the art that various changes and modifications can be made on the basis of the teachings of the invention. It is apparent that such changes and modifications are within the spirit, scope, and intention of the inventions as defined by the appended claims.

In addition, the joint connector and the method for identifying the bus bar pattern in the joint connector of the invention are not limited to the embodiment described above, and proper modifications, improvements, etc. can be made. Moreover, for example, any materials, shapes, dimensions, placement of each component and the number of components in the embodiment described above can be used and they are not limited as long as the invention can be achieved.

For example, the number of terminal receiving chambers formed in the housing or a kind of pattern of the bus bar received in the housing can be designed and changed to any number different from the embodiment described above.

The present invention is extremely useful to easily visually determine a pattern of a bus bar received in the joint connector and to identify the pattern of the received bus bar by a continuity test.

What is claimed is:

1. A joint connector, comprising:

a bus bar for juxtaposing plural tab pieces to be connected to mating terminals, and a housing, having a bus bar accommodating part accommodating the bus bar, including plural terminal receiving chambers for receiving the mating terminals, and formed with plural continuity check holes at a back end of the housing so as to expose a back end of the bus bar, wherein, in a case where the plural bus bars are accommodated in the bus bar accommodating parts, at least one of the continuity check holes is positioned between the adjacent bus bars, and the at least one of the continuity check holes is filled with an insulating resin material to be a resin-sealed part.

2. The joint connector according to claim 1, wherein the continuity check holes are arranged in a pitch so as to be arranged at middle between the adjacent terminal receiving chambers.

3. A method for identifying a bus bar pattern in the joint connector described in claim 1, comprising:

preparing plural continuity test pins, disposed at positions each of which corresponding to the resin-sealed part provided in each of bus bar patterns;

preparing plural continuity pins, disposed at positions each of which corresponding to the continuity check holes which is not formed in the resin-sealed part in any bus bar patterns;

executing continuity tests for each of the continuity test pins; and identifying the bus bar pattern based on arrangement of the continuity test pins which become non-conducting to the bus bar.

* * * * *